United States Patent
Hosokawa et al.

(10) Patent No.: US 8,063,620 B2
(45) Date of Patent: Nov. 22, 2011

(54) SWITCHING POWER SUPPLY DEVICE AND SEMICONDUCTOR INTEGRATED CIRCUIT

(75) Inventors: Kyoichi Hosokawa, Tokyo (JP); Ryotaro Kudo, Tokyo (JP); Toshio Nagasawa, Tokyo (JP); Koji Tateno, Tokyo (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 0 days.

(21) Appl. No.: 13/023,560

(22) Filed: Feb. 9, 2011

(65) Prior Publication Data

US 2011/0127975 A1   Jun. 2, 2011

Related U.S. Application Data

(63) Continuation of application No. 12/403,966, filed on Mar. 13, 2009, now Pat. No. 7,902,799, which is a continuation of application No. 10/587,215, filed as application No. PCT/JP2005/000329 on Jan. 14, 2005, now Pat. No. 7,514,908.

(30) Foreign Application Priority Data

Jan. 28, 2004   (JP) .................................. 2004-20517

(51) Int. Cl.
G05F 1/40   (2006.01)
G05F 1/10   (2006.01)
(52) U.S. Cl. ......................... 323/282; 323/222; 323/271
(58) Field of Classification Search .................. 323/222, 323/223, 225, 268, 271, 282, 285; 363/59, 363/60; 327/333, 390
See application file for complete search history.

(56) References Cited

U.S. PATENT DOCUMENTS

| 5,646,571 A | 7/1997 | Ohashi |
| 5,666,280 A | 9/1997 | Janaswamy et al. |
| 6,324,084 B1 | 11/2001 | Fujisawa |

(Continued)

FOREIGN PATENT DOCUMENTS

CN   1447506 A   10/2003

(Continued)

OTHER PUBLICATIONS

Office Action from Taiwan Patent Application No. 093137949, Jan. 18, 2011 ✓.

*Primary Examiner* — Matthew Nguyen
(74) *Attorney, Agent, or Firm* — Miles & Stockbridge P.C.

(57) ABSTRACT

The present invention provides a switching power source and a semiconductor integrated circuit which realize an acquisition a sufficient driving voltage of a high-potential side switching element M1 even when a power source voltage VDD is low. In a switching power source which controls a current which flows in an inductor through a switching element which performs a switching operation in response to a PWM signal, and forms an output voltage by a capacitor which is provided in series in the inductor, a booster circuit which is constituted of a bootstrap capacity and a MOSFET is provided between an output node of the switching element and a predetermined voltage terminal, the boosted voltage is used as an operational voltage of a driving circuit of the switching element, another source/drain region and a substrate gate are connected with each other such that when the MOSFET is made to assume an OFF state, and a junction diode between one source/drain region and the substrate gate is inversely directed with respect to the boosted voltage which is formed by the bootstrap capacity.

10 Claims, 7 Drawing Sheets

U.S. PATENT DOCUMENTS

| | | |
|---|---|---|
| 6,359,493 B2 | 3/2002 | Satomi |
| 6,643,144 B2 | 11/2003 | Feldtkeller |
| 6,927,986 B2 | 8/2005 | Nishimaki |
| 7,170,264 B1 * | 1/2007 | Galinski ............ 323/222 |
| 7,317,302 B1 | 1/2008 | Collins |
| 7,521,988 B2 | 4/2009 | Shin |
| 2003/0001548 A1 | 1/2003 | Feldtkeller |
| 2007/0114983 A1 * | 5/2007 | Weng et al. ........ 323/282 |
| 2008/0136487 A1 | 6/2008 | Chen et al. |

FOREIGN PATENT DOCUMENTS

| | | |
|---|---|---|
| JP | 6-21733 A | 1/1994 |
| JP | 7-222439 A | 8/1995 |
| JP | 11-501500 A | 2/1999 |
| JP | 2002-095248 A | 3/2002 |
| JP | 2002-315311 A | 10/2002 |
| JP | 2003-520556 A | 7/2003 |
| JP | 2003-235251 A | 8/2003 |
| JP | 2003-309978 A | 10/2003 |
| TW | 508898 | 11/2002 |

* cited by examiner

SWITCHING POWER SUPPLY DEVICE AND SEMICONDUCTOR INTEGRATED CIRCUIT

CROSS-REFERENCE TO RELATED APPLICATIONS

This application is a continuation of application Ser. No. 12/403,966 filed Mar. 13, 2009 now U.S. Pat. No. 7,902,799, which is a continuation of application Ser. No. 10/587,215 filed Jul. 25, 2006 now U.S. Pat. No. 7,514,908, which is a 371 of International Patent Application No. PCT/JP2005/000329 filed Jan. 14, 2005.

TECHNICAL FIELD

The present invention relates to a switching power source and a semiconductor integrated circuit and, for example, to a technique which is effectively applicable to a switching power source which converts a high voltage into a low voltage and a semiconductor integrated circuit which is used in the switching power source.

BACKGROUND OF THE INVENTION

A switching power source is required to satisfy a low cost, miniaturization, high efficiency, a low voltage and a large current. Accordingly, as a switching element, an N-channel type power MOSFET (hereinafter abbreviated as NMOS) which is manufactured at a low cost and exhibits the low ON-resistance (low Ron) and the low Qgd (low gate charge quantity) is used in many cases. FIG. 13 shows the constitution of a step-down type switching power source which is studied prior to the present invention. In using the NMOS in a high potential-side switching element M1, a booster circuit which is referred to as "bootstrap" and a level shifting circuit shown in the drawing are necessary. In the booster circuit shown in FIG. 13, a voltage (VDD-Vf) which is lower than a power source voltage VDD by an amount corresponding to a forward voltage Vf of a diode D4 is supplied for driving high-potential side switching element M1. That is, the voltage which is higher than a source (middle point LX) of the switching element Ml by the voltage (VDD-Vf) stored in the bootstrap CB is supplied to a gate of the switching element M1. To increase the above-mentioned voltage (VDD-Vf), a Schottky barrier diode which exhibits a low forward voltage Vf is used as a diode D4.

FIG. 14 shows operational waveforms of respective parts of the step-down-type switching power source shown in FIG. 13. In the step-down-type switching power source, a middle point LX between the high-potential side switching element M1 and the low-potential side switching element M2 is changed to an input voltage yin and a ground potential VSS for every switching. The booster circuit charges a bootstrap capacity CB from a power source voltage VDD through a diode D4 during a period that a potential of the middle point LX assumes a ground potential VSS. Accordingly, both-end voltages of the bootstrap capacity CB assume the voltage (VDD-Vf) which falls from the power source voltage VDD by an amount corresponding to a forward voltage Vf of the diode D4. When the potential of the middle point LX assumes the input voltage Vin, the diode D4 prevents a backward flow to the power source voltage VDD and supplies electricity to a driving circuit of the high-potential side switching element M1 from the bootstrap capacity CB. A driving voltage Vgs of the high-potential side switching element M1 becomes (VDD-Vf).

On the other hand, here observed is a tendency that the power source voltage VDD of peripheral circuits including a control circuit is lowered. Accordingly, the lowering of an amount of a forward voltage Vf of the diode D4 is no more ignorable thus giving rise to a possibility that the high-potential side switching element M1 cannot obtain a sufficient driving voltage. When the driving voltage becomes insufficient, the switching element cannot exhibit original performances thereof thus bringing about an increase of loss or the like. Accordingly, an example of a switching power source which constitutes a bootstrap circuit using a junction-type FET (hereinafter abbreviated as JFET) and incorporates an IC therein, there has been known a switching power source disclosed in Japanese Patent Laid-open Heill (1999)-501500. In this switching power source, the bootstrap capacitor is charged through the JFET.

Patent document 1: Japanese Patent Laid-open Heill (1999)-501500

DISCLOSURE OF THE INVENTION

Problems to be Solved by the Invention

However, in the JFET, a leaked current in an OFF state is not ignorable and hence, a diode for preventing a backward flow is connected in series to ensure a sufficiently boosted voltage. That is, to constitute a practical circuit, in the switching power source of the above-mentioned patent document 1, the connection of the backward flow preventing diode is considered necessary thus eventually giving rise to a drawback similar to the drawback which the circuit shown in FIG. 13 possesses.

Accordingly, it is an object of the present invention to provide a switching power source which realizes an acquisition of a sufficient driving voltage of a high-potential side switching element M1 even when a power source voltage VDD is low and a semiconductor integrated circuit which is used in the switching power source.

The above-mentioned and other objects and novel features of the present invention will become apparent from the description of this specification and attached drawings.

Means for Solving the Problems

To briefly explain the summary of typical inventions among inventions disclosed in the present application, they are as follows. That is, in a switching power source which controls a current which flows in an inductor through a switching element which performs a switching operation in response to a PWM (pulse width modulation) signal, and forms an output voltage by a capacitor which is provided in series in the inductor, a booster circuit which is constituted of a bootstrap capacity and a MOSFET is provided between an output node of the switching element and a predetermined voltage terminal, the boosted voltage is used as an operational voltage of a driving circuit of the switching element, and another source/drain region and a substrate gate are connected with each other such that when the MOSFET is made to assume an OFF state, a junction diode between one source/drain region and the substrate gate is inversely directed with respect to the boosted voltage which is formed by the bootstrap capacity.

Advantage of the Present Invention

The switching power source and the semiconductor integrated circuit which use such a switching power source can obtain the sufficient driving voltage of the high-potential-side switching element even when the power source voltage VDD is low.

BEST MODE FOR CARRYING OUT THE INVENTION

Figure 1:
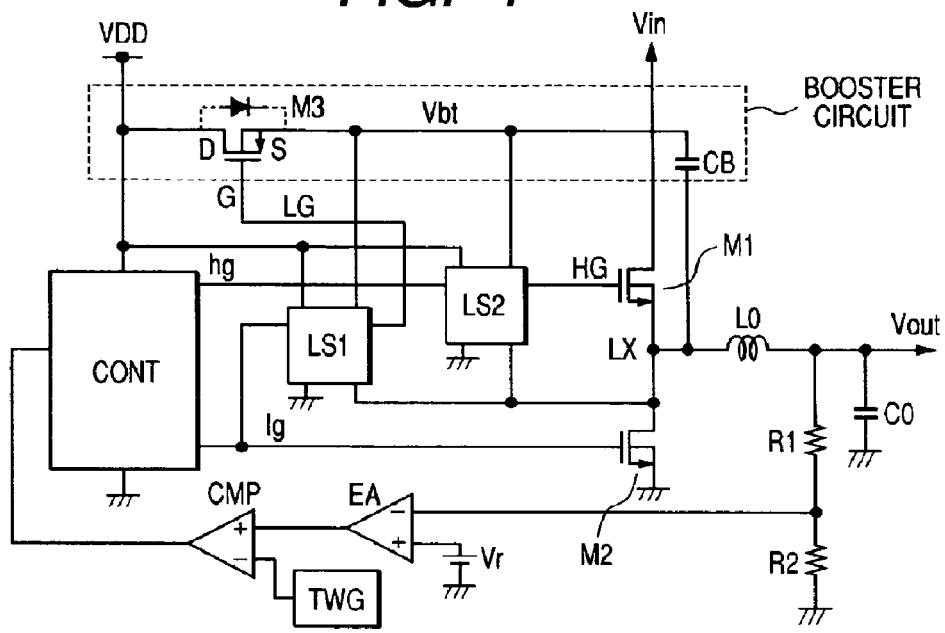
FIG. 1 is a schematic circuit diagram showing one embodiment of a switching power source according to the present invention.

FIG. 1 shows a schematic circuit of one embodiment of a switching power source according to the present invention. This embodiment is directed to a so-called step-down-type switching power source which forms an output voltage Vout by stepping down an input voltage Vin. Although not particularly limited, the input voltage Vin may be a relatively high voltage of approximately 12V and the output voltage Vout may be a low voltage of approximately 3V.

The above-mentioned input voltage Vin performs the supply of an electric current from one end of an inductor LO through a high-potential side switching element M1. A capacitor CO is provided between another end of the inductor LO and a ground potential VSS of the circuit and the smoothed output voltage Vout is formed by the capacitor CO. Between one end of the inductor LO and the ground potential VSS of the circuit, a switching element M2 which clamps a reverse electromotive voltage which is generated in the inductor LO by allowing a middle point LX to assume the ground potential of the circuit when the switching element M1 assumes an OFF state is provided. The switching elements Ml, M2 are formed of an N-channel power MOSFET. Anode of the switching elements M1, M2 constitutes the middle point LX of a so-called inverted push-pull output circuit and is connected to one end of the inductor LO.

To control the output voltage Vout to a predetermined potential of approximately 3V, a following PWM control circuit is provided. As an example, the above-mentioned output voltage Vout is divided by a voltage dividing circuit which is constituted of resistances R1, R2 and is supplied to one input (−) of an error amplifier EA. A reference voltage Vr is supplied to another input (+) of the error amplifier EA. A differential voltage between the divided voltage and the reference voltage Vr is supplied to one input (−) of a voltage comparator CMP. To another input (+) of the voltage comparator CMP, a triangular wave which is formed by a triangular wave generating circuit TWG is supplied. An output signal of the voltage comparator CMP is supplied to a control circuit CONT and the control circuit CONT forms a PWM signal which makes the divided voltage and the reference voltage Vr coincide with each other. The signal is not particularly limited to the PWM signal and any signal which can control the output voltage Vout by controlling switching of the power MOSFET such as a PFW (pulse frequency modulation) signal, a PDM (pulse density modulation) signal or the like may be used.

The control circuit CONT generates a high-voltage-side control signal hg and a low-potential-side control signal lg which correspond to the above-mentioned PWM. In this embodiment, an N-channel-type power MOSFET which exhibits the low ON resistance and the low Qgd is used as the above-mentioned switching element M1 thus allowing the control circuit CONT to be operated as a source follower output circuit. Accordingly, to allow the potential of the middle point LX to acquire the high voltage which corresponds to the input voltage Vin, that is, to prevent a phenomenon that the potential of the middle point LX is lowered by an amount corresponding to a threshold value voltage of the MOSFET M1 and a loss is generated, a booster circuit is provided. That is, the booster circuit performs an operation to set the gate voltage when the MOSFET M1 is in an ON state to the high voltage equal to or more than the input voltage Vin by an amount corresponding to the threshold value voltage.

The above-mentioned middle point LX is connected to one end of a bootstrap capacity CB. Another end of the bootstrap capacity CB is connected to a power source voltage VDD through a source-drain route of a P-channel-type switching MOSFET M3. The power source voltage VDD is a low voltage such as approximately 5V and is an operational voltage of an error amplifier EA, a voltage comparator CMP and a triangular wave generating circuit TWG which constitute the PWM control circuit including the above-mentioned control circuit CONT, wherein the power source voltage VDD is also used as an operational voltage of low-voltage-side circuits of level shifting circuits LS1, LS2 described later.

The high-voltage-side control signal hg which corresponds to the above-mentioned PWM signal has a level thereof shifted by the level shifting circuit LS2 thus forming a driving signal HG of the high-voltage-side switching element M1. The level shifting circuit LS2 uses the above-mentioned power source voltage VDD and a boosted voltage Vbt which is formed by the above-mentioned bootstrap capacity CB as operational voltages, wherein by shifting levels of the power source voltage VDD and the high-voltage-side control signal hg having ground potential (approximately 5V in this embodiment) amplitude to the boosted voltage Vbt and a signal having the middle point LX amplitude, it is possible to increase agate voltage at the time of turning on the switching element M1 to a voltage such as the boosted voltage Vbt.

A low-voltage-side control signal lg which corresponds to the PWM signal is basically supplied directly to a gate of a low-potential-side switching element M2 using a buffer or the like. The level shifting circuit LS1 shifts a level of the low-voltage-side control signal lg thus forming a control signal LG which is supplied to a gate of the P-channel-type MOSFET M3. That is, when the low-voltage-side control signal lg of the switching element M2 is inverted by the level shifting circuit thus turning off the switch M2, the control signal LG which corresponds to the boosted voltage Vbt is formed and the control signal LG is transmitted to the gate of P-channel-type MOSFET M3 thus turning off the MOSFET M3.

Figure 12:
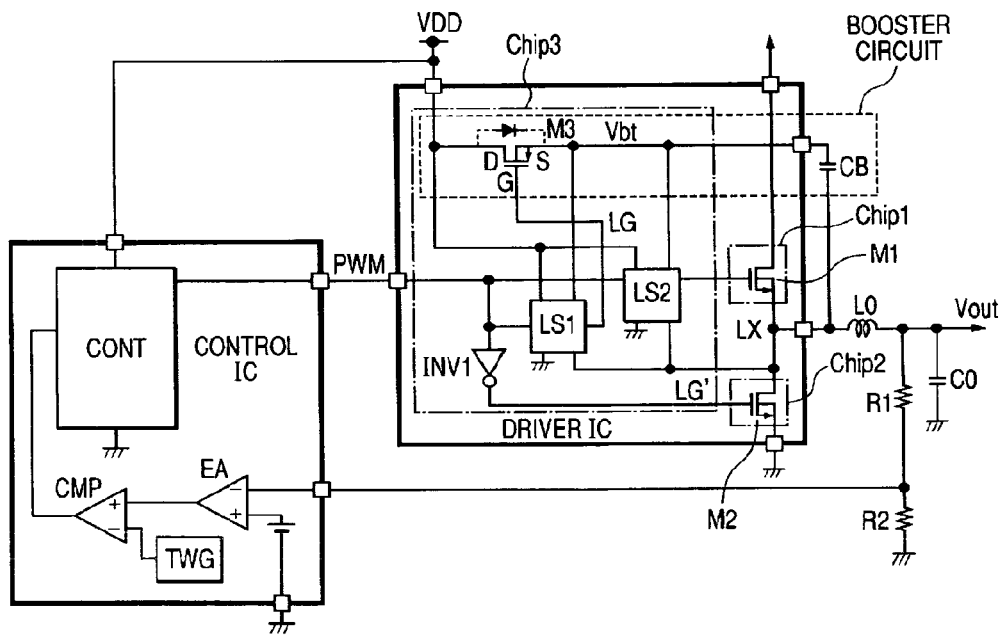
FIG. 12 is a constitutional view showing still another embodiment of the switching power source according to the present invention.
Figure 13:
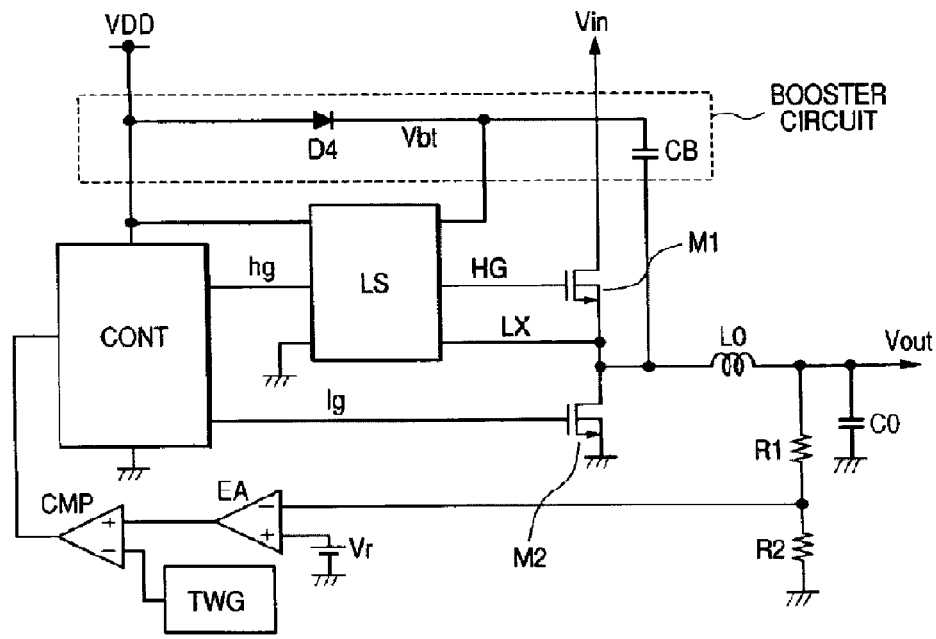
FIG. 13 is a constitutional view of a step-down type switching power source studied prior to the present invention.
Figure 14:
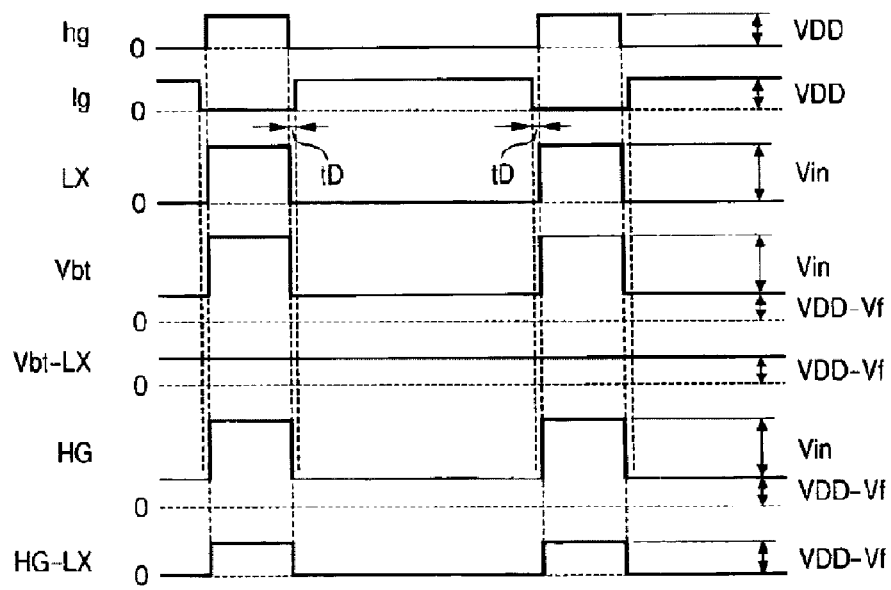
FIG. 14 is a view showing operational waveforms of respective parts of the step-down type switching power source shown in FIG. 13.

The booster circuit of the present invention is characterized by the use of the P-channel-type power MOSFET (abbreviated as PMOS) M3 which constitutes the switching element in place of a diode D4 shown in FIG. 12. Here, the PMOS M3 has a drain terminal D thereof connected to the power source VDD and a source terminal S thereof connected to the bootstrap capacity CB side. The source and the drain of the MOSFET may be reversed depending on the direction in which the voltage is applied and hence, the drain terminal D and the source terminal S shown in the drawing are arranged for a convenience sake. That is, the drain terminal D and the source terminal S imply a drain and a source in a state that the boosted voltage Vbt which is higher than the power source voltage VDD attributed to the bootstrap capacity CB is formed. A substrate gate (a back gate, a channel region or an N-type well region) of the PMOS M3 is connected to the source terminal S-side, that is, the bootstrap capacity CB side.

Figure 2:
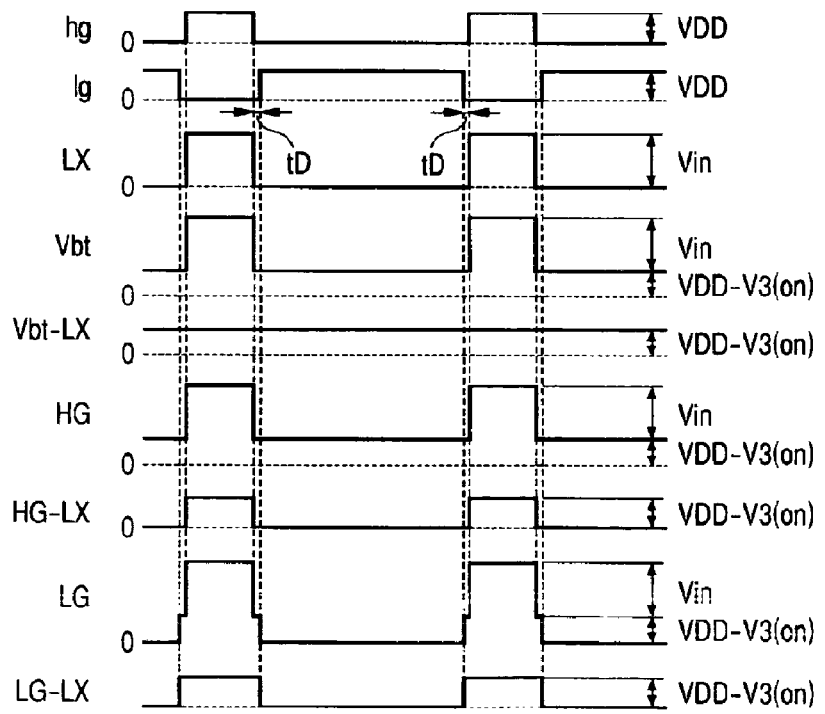
FIG. 2 is a waveform diagram for explaining an operation of a driving circuit of the switching power source shown in FIG. 1.

FIG. 2 shows waveforms for explaining an operation of the driving circuit of the switching power source shown in FIG. 1. Basically, during a period in which the switching element M2 is turned on in response to the control signals hg, lg which correspond to the PWM signal (that is, during a period in which the switching element M1 is turned off), the switching element M3 is turned on to charge the bootstrap capacity CB with the power source voltage VDD. In the drawing, this charging voltage is expressed as VDD-V3 (on). V3 (on) indicates a voltage loss in the source-drain route of the MOSFET M3 during the charging operation and is considered substantially zero.

The operation of the PMOS M3 here is referred to as a reverse directional characteristic. That is, the control signal LG of the low level such as a ground potential is supplied to the gate of the PMOS M3 from the level shifting circuit LS1, and the power source voltage VDD side (drain terminal D) is operated as the source region to assume an ON state and hence, charging to the bootstrap capacity CB is started. Here, a charging route is also formed by a parasitic diode which is constituted of a PN junction of the substrate gate and the drain terminal D which is operated as the source and hence, when the potential Vbt on the source terminal S side which is operated as the drain region is lower than (VDD-Vf) (Vf being the forward voltage of the parasitic diode), the charging current also flows through such a parasitic diode.

During a period in which the switching element M1 is turned on in response to the control signals hg, lg corresponding to the PWM signal (that is, the switching element M2 is turned on), the potential of the middle point LX is elevated from the low level due to turning-on of the switching element M1. Corresponding to the elevation of the low level, the boosted voltage Vbt of the bootstrap capacity CB is elevated as the voltage which is higher by an amount corresponding to the charging voltage VDD. That is, between the gate and the source (HG-LX) of the switching element M1, a holding voltage VDD (VDD-V3 (on)) of the bootstrap capacity CB is applied through the level shifting circuit LS2 and hence, the potential of the middle point LX obtained from the source side is elevated to a high voltage corresponding to the input voltage Vin. Here, VDD is approximately 5V and a threshold value voltage of the switching element M1 is approximately 1V thus establishing the relationship of VDD>Vth.

Due to the elevation of the boosted voltage Vbt, to a pair of source, drain of the MOSFET M3, the voltage is applied in the direction opposite to the direction that the voltage is applied to the pair of source and drain regions in the above-mentioned charging operation and hence, as shown in FIG. 1, the boosted voltage Vbt side is operated as the source terminal S and the power source voltage VDD side is operated as the drain terminal D. Accordingly, assuming that the control signal LG supplied to the gate G is set to a high level such as the power source voltage VDD, when the potential of the source terminal S is elevated to the threshold value voltage Vth or more, the switching element again assumes an ON state and the charge of the bootstrap capacity CB which forms the boosted voltage Vbt is leaked to the power source voltage VDD side. The level shifting circuit LS1 sets the high level of the control signal LG to a high voltage corresponding to the boosted voltage Vbt and maintains an OFF state by setting the gate G and the source terminal S at the same potential (equal to or below Vth). Further, the voltage is applied to the parasitic diode in the reverse direction and no current which discharges the charge of the bootstrap capacity CB flows.

The charge of the bootstrap capacity CB which is consumed in one charging operation for bringing the switching element Ml into an ON state can be roughly calculated by Cg×Vgs. Here, symbol Cg indicates a gate input capacity of the switching element M1, and symbol Vgs indicates a driving voltage between the gate and the source. By multiplying the charge with a switching frequency, it is possible to obtain an average charging current. As an example, to calculate the charging current by setting Cg, Vgs and switching frequency as Cg=3000 pF and Vgs=5V and the switching frequency=1 MHz, the charging current becomes 15 mA. Further, the ON resistance of the MOSFET M3 is several tens mΩ in general and hence, the voltage drop V3 (on) at the time of charging is small and is regarded as zero. Accordingly, this embodiment can suppress the voltage drop to an extremely small value compared to the voltage drop attributed to the forward voltage Vf of the conventional diode D4.

During the period in which the switching element M2 is turned off (during the period in which the switching element M1 is turned on) as described above, it is necessary to turn off the P-channel MOSFET M3. To turn off the P-channel MOSFET M3, the level shifting circuit LS1, by using the boosted voltage Vbt as an operational voltage, shifts a level of the control signal LG which is supplied to the gate terminal G of the P-channel MOSFET M3 to a voltage level equal to a voltage level of the boosted voltage Vbt of the source terminal S. Further, there exists a diode which is parasitic between the drain terminal D of the MOSFET M3 and the substrate gate (also referred to as a body diode). Due to this parasitic diode, the MOSFET M3 is brought into the above-mentioned OFF state and, at the same time, a backward flow toward the power sourced voltage VDD from the boosted potential Vbt can be prevented. Accordingly, it is unnecessary to newly provide a diode for preventing a backward flow which the above-mentioned patent document 1 uses as the JFET.

Since transition times to an ON state or an OFF state of the switching elements M1, M2, M3, possess irregularities attributed to the elements or the like, a dead time is provided in the changeover of the switching elements M1, M2 for preventing a through current. In the same manner, when the switching element M3 is turned on before the switching element M1 is completely turned off, a backward flow toward the power source VDD from the boosted potential side is generated and hence, the dead time is provided in the same manner. Although not particularly limited, the dead time is set by the control circuit CONT which forms a signals lg and hg corresponding to the PWM signal. As described above, the present invention provides the booster circuit which can acquire the sufficient driving voltage of the switching element M1 even when the power source voltage VDD is set to the low voltage.

Figure 3A:
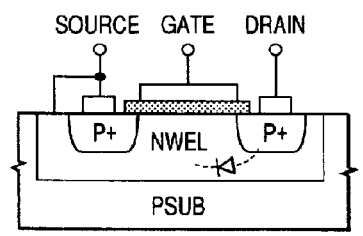
FIG. 3 is a schematic cross-sectional view of an element showing one embodiment of a P-channel MOSFET M3 shown in FIG. 1.
Figure 3B:
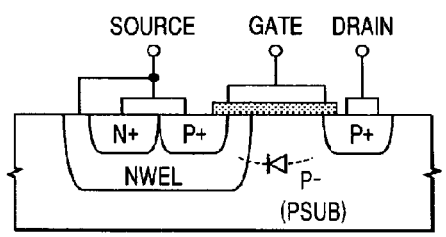

FIG. 3 shows a schematic cross-section of an element showing one embodiment of a P-channel MOSFET M3 shown in FIG. 1. FIG. 3(A) shows an example of a general P-channel MOSFET and FIG. 3(B) shows an example of a high-dielectric-strength MOSFET. From the waveforms of signals of respective portions in FIG. 2, it is understood that the boosted voltage Vbt reaches the power source voltage VDD+the input voltage Vin. Accordingly, as the P-channel MOSFET M3, it is desirable to use an LDMOS (Laterally Diffused MOS) having a high dielectric strength shown in FIG. 3(B) for a safety purpose.

In the general P-channel type MOSFET shown in FIG. 3(A), an N-type well region NWEL is formed on a P-type substrate PSUB, and a pair of P+ type source/drain regions are formed in the N-type well region NWEL. On a well region between such a pair of source, drain regions (a channel or a substrate gate), gate insulation film having a small film thickness is formed. On the gate insulation film, a gate electrode is formed in a state that the gate electrode strides over the pair of source and drain regions. Further, when the P-channel type MOSFET is used as the switching element M3 which constitutes the above-mentioned booster circuit, the well region NWEL and a P+ region which constitutes the source terminal S side in FIG. 1 are connected with each other. Between the P+ region which constitutes the drain terminal D in FIG. 1 and the substrate gate (NWEL), a parasitic diode illustrated in the drawing exists.

In the high-dielectric-strength MOSFET shown in FIG. 3(B), a P+ region which constitutes the drain terminal D is formed on a P-type substrate PSUB (P−). With respect to a semiconductor region which corresponds to the source terminal S, a P+ region is formed in an N-type well region NWEL in a state that the P+ region faces the P+ region which constitutes the drain terminal D in an opposed manner, and an N+ region for obtaining an ohmic contact is formed in the N-type well region NWEL. Further, by forming electrodes on the P+ region and the N+ region, the connection with the N-type well region NWEL is established. In this high-dielectric-strength MOSFET, with respect to the drain region, the P+ region and the P− substrate are operated as effective drain regions, while a well region (channel or substrate gate) between the P+ regions formed in the N-type well region NWEL is used as the effective substrate gate (channel region).

Above the N well region NWEL between the pair of P+ regions and the substrate PSUB, a gate insulation film having a small film thickness is formed. On the gate insulation film, a gate electrode is formed in a state that the gate electrode strides over the pair of P+ regions. Further, when the high-dielectric-strength MOSFET is used as the switching element M3 which constitutes the above-mentioned booster circuit, the well region NWEL and a P+ region which constitutes the source terminal S side in FIG. 1 are connected with each other. Between the substrate PSUB which constitutes a portion of the drain region shown in FIG. 1 and the substrate gate (NWEL) a parasitic diode illustrated in the drawing exists. In such a LDMOS, the structure of the source region and the drain region is asymmetrical and hence, the source and the drain are expressed as illustrated in the drawing to show this asymmetry.

As shown in FIG. 3(A), (B) which are schematic cross-sectional structural views of elements, the MOSFET is used in a state that the source and the substrate gate (well region) are connected with each other and hence, in both of the general P-channel MOSFET shown in FIG. 3(A) and the LDMOS shown in FIG. 3(B), the parasitic diode is present between the drain and the source. Accordingly, there arises no problem in using the P-channel MOSFET and the LDMOS in the switching element M3 in the present invention. Further, in charging the charge to the bootstrap capacity CB of the LDMOS shown in FIG. 3(B), a current is made to flow form the drain to the source in FIG. 3(B). However, this operation is an operation which is performed in a linear region (low current) and hence, there is no possibility that the performance of the switching element M3 is largely lowered.

According to the switching power source of this embodiment, even when the power source voltage VDD is lowered, the high-potential-side switching element can obtain the sufficient driving voltage. Since the N-channel power MOSFET can be used in the high-potential-side switching element, it is possible to constitute an inexpensive and miniaturized switching power source. Further, the switching power source of this embodiment also has an advantage that the switching element can be incorporated into an IC as described later. By incorporating the switching power source into the IC, it is possible to reduce the number of externally mounting parts thus contributing to the miniaturization and the reduction of cost of the power source.

In the booster circuit of the present invention, the bootstrap capacity CB is charged by turning on the P-channel MOSFET M3, and the prevention of the backward flow from the boosted potential side is achieved by turning off the MOSFET by shifting the level of the gate voltage of the MOSFET corresponding to the boosted voltage, and by making use of the body diode. Accordingly, it is possible to eliminate the diode for preventing the backward flow which is necessary in the switching power source described in the above-mentioned patent document 1. Further, since the ON resistance of the MOS is small, that is several tens of mΩ, compared to the forward voltage Vf of the diode, it is possible to suppress the lowering of the voltage during the charging. Provided that the sufficient charging time can be set, it is possible to increase the bootstrap capacity CB to VDD.

As described above, even when the power source voltage VDD is low, it is possible to obtain the sufficient driving voltage of the high-potential-side switching element M1. Accordingly, this embodiment can adopt the N-channel power MOSFET which can be manufactured at a low cost, can be miniaturized, and can exhibit the low Ron and the low Qgd as the high-potential-side switching element and hence, it is possible to constitute the switching power source which can be manufactured at a low cost and can be miniaturized. Further, since the MOSFET exhibits the smaller chip area compared to the Shottky barrier diode, the MOSFET can be easily incorporated into the IC. Accordingly, it is possible to eliminate an externally mounted diode whereby this embodiment is suitable for the miniaturization and the reduction of cost of the power source.

Figure 4:
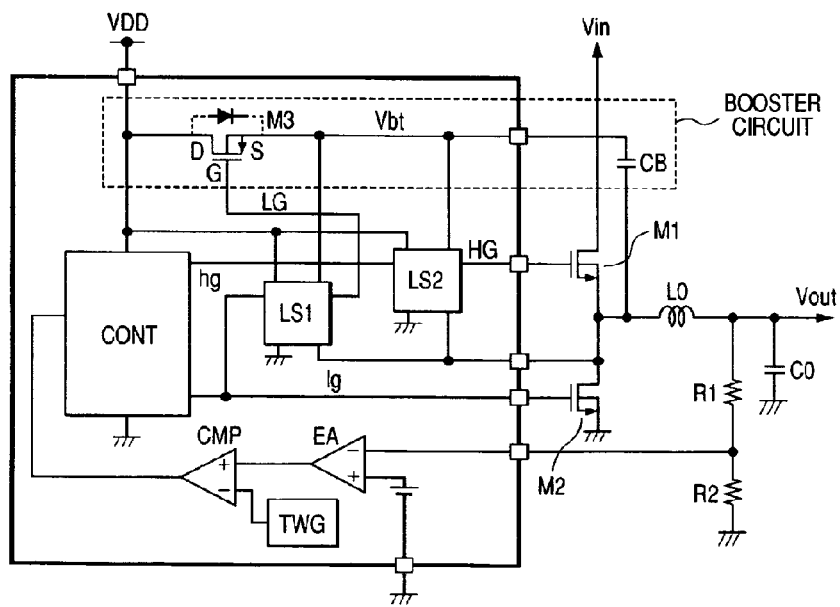
FIG. 4 is a constitutional view showing one embodiment of the switching power source according to the present invention.

FIG. 4 shows the constitution of one embodiment of the switching power source according to the present invention. In the switching power source of this embodiment, a portion surrounded by a frame indicated by a bold line is constituted of a semiconductor integrated circuit (IC). That is, the high-potential-side switching element M1 and the low-potential-side switching element M2 are constituted of an externally mounted unit element. Further, the inductor LO, the bootstrap capacity CB and the capacitor CO, and the resistances R1, R2 which constitute the voltage dividing circuit are also constituted of a unit element. In this embodiment, the switching element M3 which constitutes the booster circuit is formed in a state that the switching element M3 is incorporated in the semiconductor integrated circuit. That is, in the semiconductor integrated circuit, besides the MOSFET M3, the error amplifier EA, the voltage comparator CMP, the triangular wave generating circuit TWG, the control circuit CONT, the level shifting circuits LS1, LS2 and the like are formed. Although not shown in the drawing, the driving circuits which drive the MOSFETs M1, M2 are also incorporated in the semiconductor integrated circuit. In this embodiment, by forming control parts into the semiconductor integrated circuit and by incorporating the bootstrap switching element M3 in the semiconductor integrated circuit, it is possible to realize the reduction of number of parts and the miniaturization of the power source.

Figure 5:
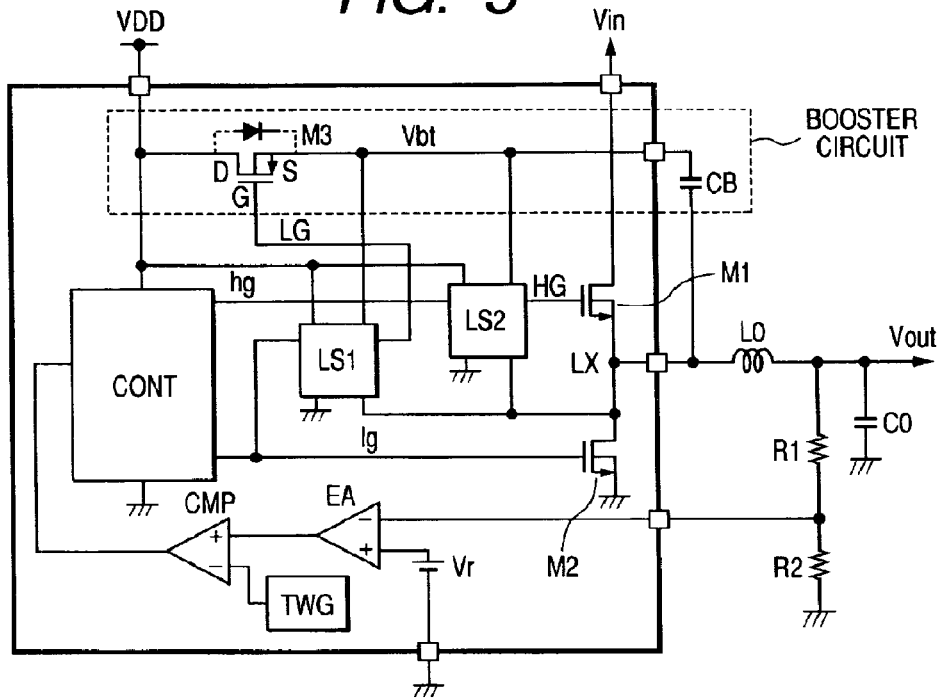
FIG. 5 is a constitutional view showing another embodiment of the switching power source according to the present invention.

FIG. 5 shows the constitution of another embodiment of the switching power source according to the present invention. Also in this drawing, a portion which is surrounded by a frame indicated by a bold line is constituted of a semiconductor integrated circuit (IC) in the same manner as the above-mentioned embodiment. In this embodiment, by also incorporating the switching elements M1, M2 in the semiconductor integrated circuit, the number of externally mounting parts can be further reduced and hence, this embodiment is suitable for the miniaturization and the reduction of the cost of the power source.

Figure 6:
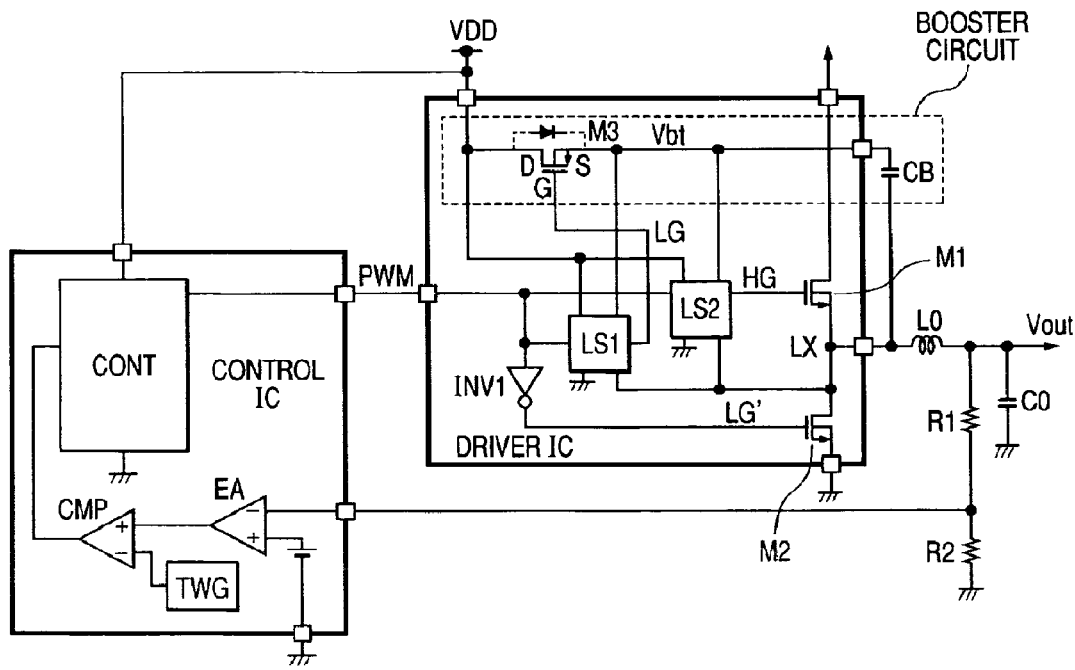
FIG. 6 is a constitutional view showing still another embodiment of the switching power source according to the present invention.

FIG. 6 shows the constitution of still another embodiment of the switching power source according to the present invention. Also in this drawing, a portion which is surrounded by a frame indicated by a bold line is constituted of a semiconductor integrated circuit (IC) in the same manner as the above-mentioned embodiment. In this embodiment, two semiconductor integrated circuits for a control IC and a driver IC are used. The control IC mounts an error amplifier EA, a voltage comparator CMP, a triangular wave generating circuit TWG and a control circuit CONT which constitute a PWM control part thereon and outputs a PWM signal. The driver IC includes switching elements M1, M2, level shifting circuits LS1, LS2, a MOSFET M3 which constitutes a booster circuit, and an inverter circuit INV1 which forms a control signal LG' on a lower potential side upon receiving a PWM signal. In this embodiment, the level shifting circuit LS1 forms a control signal LG of the switching MOSFET M3 upon receiving the PWM signal.

Figure 7:
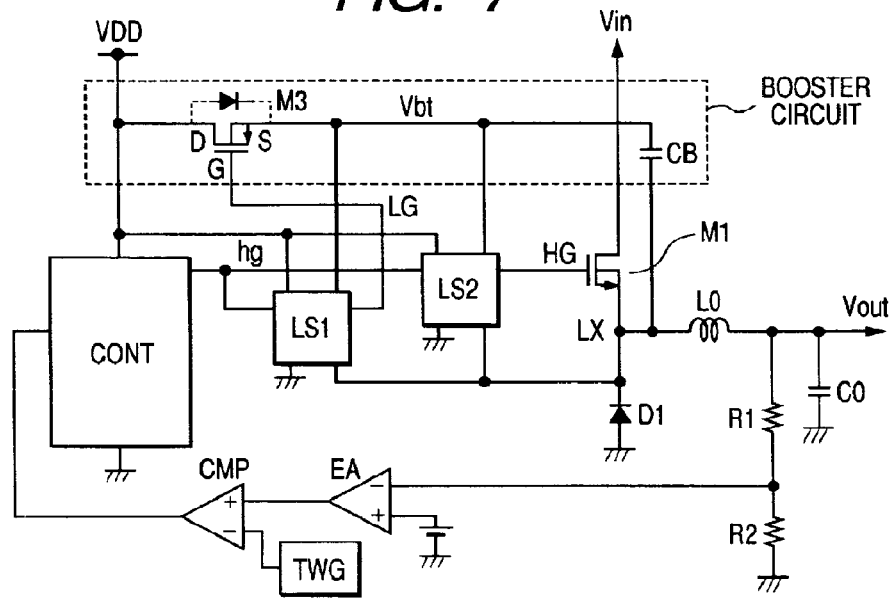
FIG. 7 is a schematic circuit diagram showing another embodiment of the switching power source according to the present invention.

FIG. 7 shows the schematic circuit of another embodiment of the switching power source according to the present invention. This embodiment is a modification of the embodiment shown in FIG. 1, wherein a diode D1 is used in place of the switching MOSFET M2 on the low voltage side. When the diode D1 is used in this manner, although a voltage loss is generated by an amount corresponding to a forward voltage Vf in an ON state, an ON/OFF is automatically operated due to a potential relationship between an anode and a cathode and hence, the above-mentioned control signal lg becomes unnecessary. In the so-called step-down-type switching power source, the above-mentioned control signals lg, hg have the complementary relationship as shown in FIG. 2. A control signal LG of a MOSFET M3 of a booster circuit of this embodiment may be generated based on the control signal hg of the MOSFET TM1. This embodiment also can adopt the constitutions shown in FIG. 4, FIG. 5 and FIG. 6.

Figure 8:
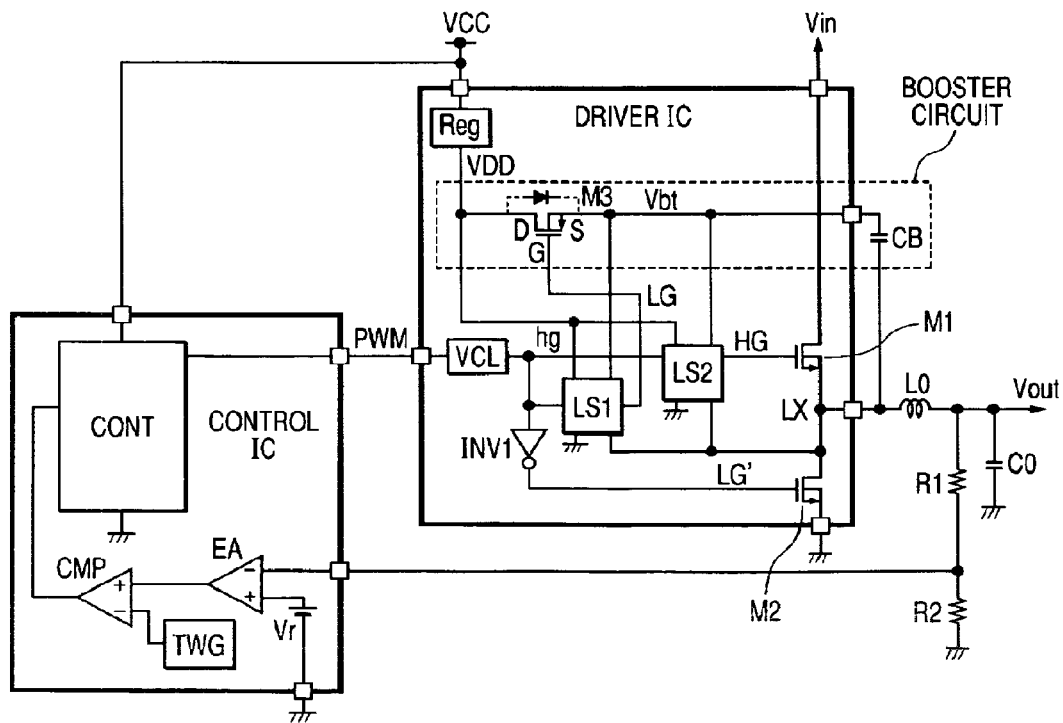
FIG. 8 is a constitutional view showing still another embodiment of the switching power source according to the present invention.

FIG. 8 shows the constitution of still another embodiment of the switching power source according to the present invention. Also in this drawing, two semiconductor integrated circuits for a control IC and a driver IC are used in the same manner as the embodiment shown in FIG. 6. A common operational voltage VCC is applied to the control IC and the driver IC, for example. The voltage VCC may be a low voltage such as the above-mentioned VDD or a high voltage corresponding to an input voltage Vin. Accordingly, the driver IC includes a step-down power source circuit Reg and forms an internal voltage corresponding to the VDD. On the other hand, the control IC forms the PWM signal corresponding to the above-mentioned power source voltage VCC. Accordingly, the driver IC includes a voltage clamping circuit VCL which receives the PWM signal. Other constitution is substantially equal to the constitution of the embodiment shown in FIG. 6 and hence, their explanation is omitted.

In this embodiment, the driver IC requires no particular power source VDD and can use the input voltage Vin as the power source voltage VCC. By stepping down such a high voltage in the inside of the driver IC and by using the stepped-down voltage as the low voltage, it is possible to reduce the power consumption in the internal driver circuit. In this case, the PWM control IC and driver IC are operated with operational voltages different from each other. That is, the control IC is operated with 12V and the driver IC is operated with the internal voltage of 5V and hence, a suitable voltage clamping mean is provided to an input circuit (VCL) of the PWM signal.

Figure 9:
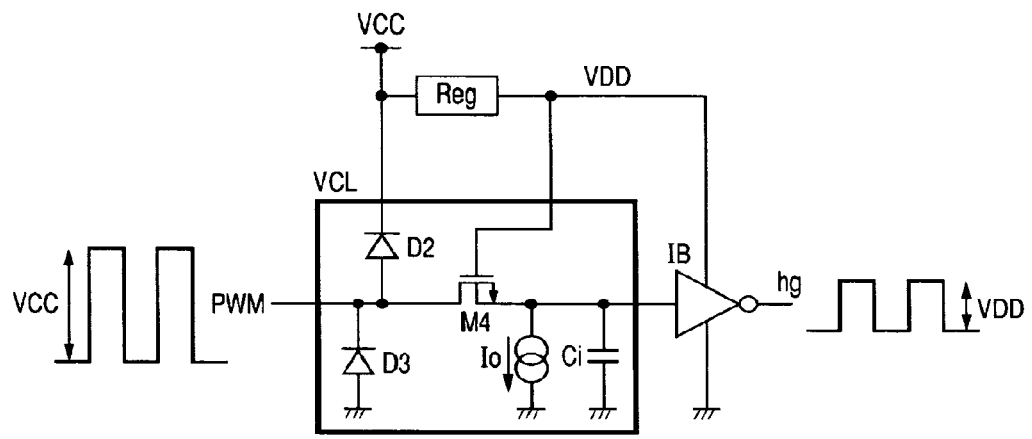
FIG. 9 is a circuit diagram showing one embodiment of a voltage clamping circuit VCL shown in FIG. 8.

FIG. 9 shows a circuit of one embodiment of a voltage clamping circuit VCL shown in FIG. 8. The voltage clamping circuit VCL shown in the drawing clamps a level of an input signal (PWM) having high signal amplitude VCC which is supplied from an external terminal of the driver IC to a level which corresponds to an operational voltage VDD level on a low voltage side of an inverter circuit INV 1 and level shifting circuits LS1, LS2 of the driver IC.

In the input terminal PWM, diodes D2, D3 which constitute an electrostatic breakdown preventing circuit are provided. Although not particularly limited, the driver IC of this embodiment includes two operational voltages, that is, a high voltage VCC and a low internal voltage VDD which is formed by a power source circuit Reg. The diode D2 is provided between the input terminal PWM and the power source terminal VCC, while the diode D3 is provided between the input terminal PWM and a ground potential VSS of the circuit. Although not particularly limited, the power source voltage VCC is a high voltage of approximately 12V and the internal voltage VDD is a low voltage of approximately 5V.

The input terminal PWM is connected to one source-drain route of the N-channel MOSFET M4 which constitutes the voltage clamping circuit. The internal voltage VDD is supplied to a gate of the MOSFET M4 as a voltage to be restricted. An output voltage which is clamped by the internal voltage VDD is obtained from another source-drain route of the MOSFET M4 and is transmitted to an input terminal of an input circuit IB. In this embodiment, to perform the voltage clamping operation by the MOSFET M4 in a stable manner, a current source Io is provided between another source-drain route and a ground potential of the circuit. Further, a capacitor Ci is provided in parallel to the current source Io.

In this embodiment, an input signal having large signal amplitude such as VCC-0V (12V-0V) indicated as a waveform in the drawing is supplied to the input terminal PWM, while from another source-drain route of the MOSFET M4, a voltage whose signal amplitude is shifted to the small restricted value by the power source VDD such as (VDD-Vth)-0V is outputted. Further, an output voltage Vo which passes the input circuit IB has CMOS amplitude such as VDD-0V (5V-0V) as indicated by a waveform in the drawing. Here, Vth is a threshold value voltage of the MOSFET M4. Although not particularly limited, the MOSFET M4 is formed on the P-type well region which is electrically separated from the substrate and such a P-type well (channel region) is connected to another source-drain route which constitutes an output side of the MOSFET M4.

In the above-mentioned voltage clamping circuit, when a leak current route attributed to a high resistance generated by the defective insulation of the circuit or the like is formed at a node V on an output side of the MOSFET M4, the potential is elevated and hence, the MOSFET M4 is held in an OFF state whereby, unless the above-mentioned current source Io is present, the voltage clamping operation becomes inoperable. By providing the current source Io, the elevation of the potential on the output node side can be suppressed and hence, the stable voltage clamping operation can be performed. Accordingly, it is sufficient to set the current source Io to a fine current which is larger than a leaked current and is not regarded as defective thus realizing the low power consumption.

Further, a parasitic capacity Cds is present between the source and the drain of the MOSFET M4. Due to this parasitic capacity Cds, when the input signal PWM is changed to a high voltage such as VCC, there arises a drawback that the voltage on the output side is changed to a level equal to or more than the power source voltage VDD due to coupling. To obviate such a drawback, the capacitor Ci is provided in parallel to the current source Io. Due to such a constitution, the parasitic capacity Cds and the capacitor Ci are connected in series and the input voltage PWM is divided corresponding to an inverse proportion of a capacity ratio thus preventing the output side node from having the voltage level equal to or more than the power source voltage VDD.

Here, although a gate capacity of the MOSFET which constitutes an input circuit is present in the input circuit IB, only with such a gate capacity, the voltage of the output side node is changed to a level equal to or more than the power source voltage VDD due to the above-mentioned coupling. Accordingly, the capacitor Ci is set to a value which is sufficiently large compared to the input capacity of the input circuit IB. In this embodiment, although the voltage clamping circuit is applied to the input signal PWM, this circuit is applicable to the input signal of a voltage level higher than the internal operational voltage. As an example, an operational ON/OFF control signal of the driver IC or the like may be named. By applying the clamping circuit shown in FIG. 9 to the terminal to which the input signal PWM shown in FIG. 8 is inputted, this embodiment can respond to the high-speed change of the PWM signal thus realizing an accurate control of the driver IC.

Figure 10:
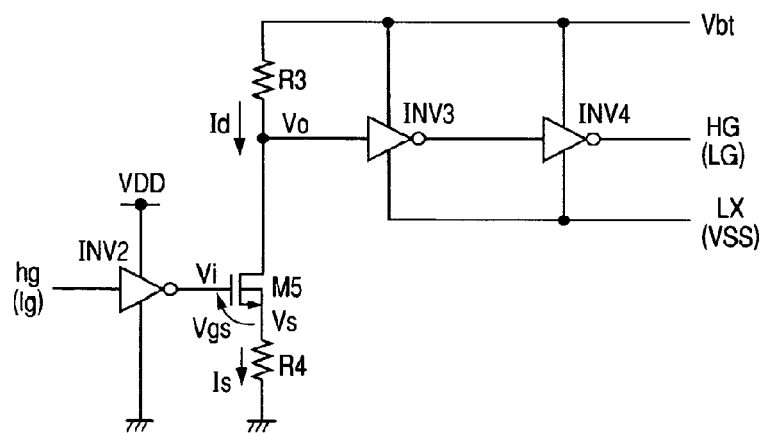
FIG. 10 is a circuit diagram showing one embodiment of a level shifting circuit LS2 used in the switching power source according to the present invention.

FIG. 10 shows a circuit of one embodiment of the level shifting circuit LS2 which is used in the switching power source according to the present invention. In the level shifting circuit of this embodiment, a CMOS inverter circuit INV2 which is operated with a power source voltage VDD is provided as an input circuit. As an input of the inverter circuit INV2, the control signal hg is supplied. An output signal of the inverter circuit INV2 is supplied to a gate of an N-channel MOSFET MS. A load resistance R3 is provided between a drain of the MOSFET MS and a boosted voltage Vbt. Although not specifically limited, a resistance R4 is provided between the source of MOSFET MS and a ground potential of a circuit. The drain output of the above-mentioned MOSFET MS is outputted as a driving signal HG which has a level thereof shifted through CMOS inverter circuits INV3 and INV4 which are operated with the boosted voltage Vbt and a potential of the middle point LX.

When the control signal hg is at a low level (VSS), the output signal of the inverter circuit INV2 assumes a high level so as to bring the MOSFET M5 into an ON-state. An operating point of the circuit in this state can be obtained as follows. In FIG. 10, assuming a gate voltage of MOSFET M5 as Vi, a source voltage as Vs, a drain voltage as Vo, a gate-source voltage as Vgs, a current which flows through the resistance R4 as Is and a current which flows through the resistance R3 as Id, following relationships are established.

$$Vs=Vi-Vgs=Is \times R4 \qquad \text{Formula (1)}$$

$$Is \approx Id \qquad \text{Formula (2)}$$

$$Vo=Vbt-Id \times R3 \approx Vbt-Is \times R3 \qquad \text{Formula (3)}$$

In the formula (1), Vgs is a value which is determined based on the characteristic of the above-mentioned MOSFET M5.

The following relationship is derived from above-mentioned formulae.

$$Vo=Vbt-(Vi-Vgs) \times (R3/R4) \qquad (4)$$

Here, values of the above-mentioned resistances R3, R4 are determined so as to set an input voltage of the inverter circuit INV3, that is, the above-mentioned drain voltage Vo to a potential lower than a logic threshold value of the drain voltage Vo. Accordingly, the inverter circuit INV3 outputs a high level corresponding to the boosted voltage Vbt, and a low-level driving signal HG corresponding to the potential of the middle point LX is formed by the inverter circuit INV4.

When the control signal hg assumes a high level (VDD), the output signal of the inverter circuit INV2 assumes a low level so as to bring the MOSFET M5 into an OFF-state. Accordingly, the drain output of the MOSFET M5 is outputted as a high-level voltage such as the boosted voltage Vbt due to the resistance R3. Accordingly, the input voltage of the inverter circuit INV3 assumes a potential higher than a logic threshold value of the input voltage and outputs a low level corresponding to the potential of the middle point LX, while a high-level driving signal HG corresponding to the boosted voltage Vbt is formed by the inverter circuit INV4. The above-mentioned level shifting circuit is characterized in that the output of the circuit is fixed even at the time of supplying the power source and does not fall into an unstable state which a conventional latch-type level shifting circuit falls.

The level shifting circuit LS1 which forms a control signal LG to be supplied to the gate of the switch of MOSFET M3 is also constituted of a substantially equal circuit as indicated by a parenthesis in FIG. 10. Here, a low potential side of the inverter circuits INV3, INV4 assumes the ground potential (VSS) of the circuit. When an inverting signal of a control signal (lg) is outputted as the control signal (LG), the above-mentioned inverter circuit INV4 is omitted.

Figure 11:
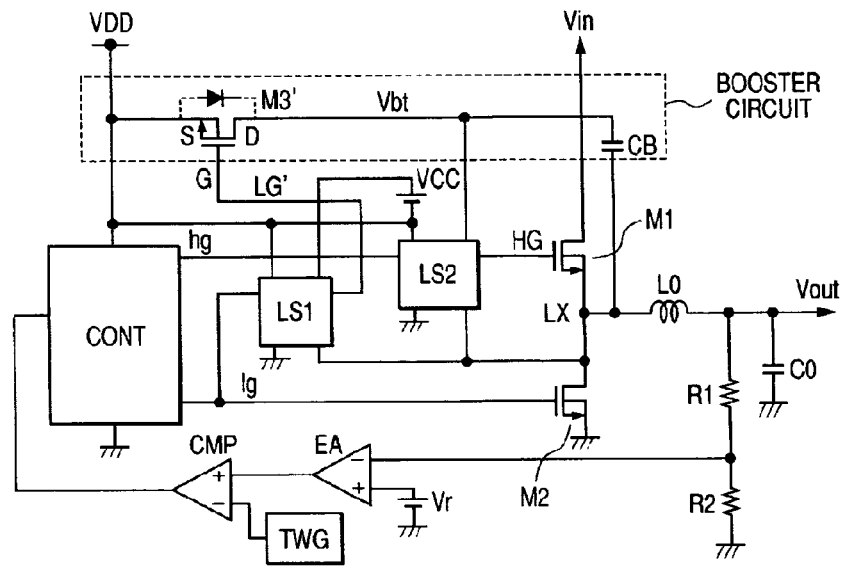
FIG. 11 is a schematic circuit diagram showing still another embodiment of the switching power source according to the present invention.

FIG. 11 shows a schematic circuit diagram of another embodiment of the switching power source according to the present invention. This embodiment is a modification of the embodiment shown in FIG. 1, wherein an N-channel MOSFET M3' is used as a switching element of the booster circuit. In using the N-channel MOSFET M3' in this manner, to turn on the MOSFET M3 for charging the bootstrap capacity CB up to the power source voltage VDD, it is necessary to set the gate voltage to the power source voltage VDD or more. For this end, the level shifting circuit LSI is operated based on the boosted voltage VCC. This VCC may be supplied from the outside, or may be formed of the similar booster circuit. In this manner, when the N-channel MOSFET is used, the source, drain regions of the power source voltage VDD side and the substrate gate are connected with each other, and a parasitic diode between the source and drain regions on the boosted voltage side and the substrate gate is utilized for preventing the backward flow. Since the circuit for generating the boosted voltage VCC becomes necessary, the P-channel MOSFET is superior to the N-channel MOSFET as the switching element of the booster circuit.

FIG. 12 shows the constitution of still another embodiment of the switching power source according to the present invention. This embodiment is a modification of the embodiment shown in FIG. 6. Although the driver IC may be constituted of the semiconductor integrated circuit which is formed on one semiconductor substrate as shown in FIG. 6, in this embodiment, the above-mentioned MOSFETs M1, M2 and other circuits are respectively prepared using processes suitable for respective circuits on semiconductor chips (semiconductor substrates) Chip 1, Chip 2, Chip 3 which are indicated by a chain line in FIG. 12, and these parts are sealed in one package as the multiple chip module constitution thus forming a semiconductor integrated circuit device. Further, three semiconductor integrated circuit devices may be constituted by sealing the respective semiconductor chips Chip 1, Chip 2, Chip 3 in separate packages and a circuit may be constituted by connecting these semiconductor integrated circuit devices with each other on a mounting substrate.

Although the invention which is made by inventors of the present invention has been specifically explained in conjunction with the embodiments, the present invention is not limited to such embodiments and various modifications can be made without departing from the gist of the present invention. For example, the switching element M2 on the low potential side may be provided with a driving circuit which is driven with a high voltage. In this case, it is possible to clamp a middle point LX which is generated in the inductor to a ground potential by a small ON resistance value of the switching element M2 and hence, the switching element can be further miniaturized or is further efficiently operated. Specific circuits of the level shifting circuit LS1, LS2 may adopt various modes for carrying out the invention. The present invention is broadly applicable to switching power source devices.

EXPLANATION OF SYMBOLS

D1 to D4 : diode, M1 to M3, M3':MOSFET, Io: current source, Ci: capacitor, CONT: control circuit, EA: error amplifier, CMP: voltage comparator, TWG: triangular wave generating circuit, IB: input circuit, CB: bootstrap capacity, LO: inductor, CO: capacitor, R1 to R4: resistance, INV1 to INV4: CMOS inverter circuit, Reg: power source circuit, LS1, 2: level shifting circuit

The invention claimed is:

1. A semiconductor device for a switching regulator and for use with a capacitor, the semiconductor device comprising:
an input voltage terminal;
an output terminal;
a ground potential terminal;
a power terminal;
a first semiconductor chip including a first MOSFET having a source-drain path coupled between the input voltage terminal and the output terminal and a gate;
a second semiconductor chip including a second MOSFET having a source-drain path coupled between the output terminal and the ground potential terminal and a gate; and
a third semiconductor chip coupled to the power terminal, coupled to provide a first control signal to the gate of the first MOSFET and coupled to provide a second control signal to the gate of the second MOSFET, the third semiconductor chip comprising a P-channel switch MOSFET having a source-drain path coupled between the power terminal and the output terminal via the capacitor,
wherein the switch MOSFET is in a conductive state when the second MOSFET is in the conductive state and is in a non-conductive state when the second MOSFET is in a non-conductive state,
wherein the switch MOSFET has a source region of a P-type and a drain region of the P-type and is formed in an N-type region and includes a parasitic diode between the drain region and the N-type region, the parasitic diode being in a reverse bias state when the second MOSFET is in the non-conductive state, and
wherein the first semiconductor chip, the second semiconductor chip and the third semiconductor chip are disposed in a package.

2. A semiconductor device according to claim 1, wherein the first MOSFET and the second MOSFET are N-channel MOSFETs,
wherein the source region of the first MOSFET is coupled to the drain region of the second MOSFET.

3. A semiconductor device according to claim 1, wherein the third semiconductor chip includes a pulse width modulation circuit which provides pulse width modulation signals as the first control signal and the second control signal.

4. A semiconductor device according to claim 1, wherein an amplitude of the first control signal is larger than a voltage applied to the power terminal.

5. A semiconductor device according to claim 1, wherein a voltage from the power terminal is lower than a voltage supplied to the input voltage terminal.

6. A semiconductor device for a switching regulator and for use with a capacitor, the semiconductor device comprising:
an input voltage terminal;
an output terminal;
a ground potential terminal;
a power terminal;
a first semiconductor chip including a first MOSFET having a source-drain path coupled between the input voltage terminal and the output terminal, and a gate;
a second semiconductor chip including a second MOSFET having a source-drain path coupled between the output terminal and the ground potential terminal and a gate; and
a third semiconductor chip coupled to the power terminal, coupled to provide a first control signal to the gate of the first MOSFET and coupled to provide a second control signal to the gate of the second MOSFET, the third semiconductor chip comprising an N-channel switch MOSFET with having a source-drain path coupled between the power terminal and the output terminal via the capacitor,
wherein the switch MOSFET is in a conductive state when the second MOSFET is in the conductive state and is in a non-conductive state when the second MOSFET is in a non-conductive state, wherein the switch MOSFET has a source region of an N-type and a drain region of the N-type and is formed in a P-type region and includes a parasitic diode between the P-type region and the drain region and, the parasitic diode being in a reverse bias state when the second MOSFET is in the non-conductive state, and wherein the first semiconductor chip, the second semiconductor chip and the third semiconductor chip are disposed in a package.

7. A semiconductor device according to claim 6,
wherein the first MOSFET and the second MOSFET are N-channel MOSFETs,
wherein the source region of the first MOSFET is coupled to the drain region of the second MOSFET.

8. A semiconductor device according to claim 6,
wherein the third semiconductor chip includes a pulse width modulation circuit which provides pulse width modulation signals as the first control signal and the second control signal.

9. A semiconductor device according to claim 6,
wherein an amplitude of the first control signal is larger than a voltage applied to the power terminal.

10. A semiconductor device according to claim 6,
wherein a voltage from the power terminal is lower than a voltage supplied to the input voltage terminal.

* * * * *